(12) United States Patent
Vogelsang (10) Patent No.: US 9,214,219 B2
(45) Date of Patent: Dec. 15, 2015

(54) DISTRIBUTED SUB-PAGE SELECTION

(75) Inventor: Thomas Vogelsang, Mountain View, CA (US)

(73) Assignee: Rambus Inc., Sunnyvale, CA (US)

( * ) Notice: Subject to any disclaimer, the term of this patent is extended or adjusted under 35 U.S.C. 154(b) by 56 days.

(21) Appl. No.: 14/238,921

(22) PCT Filed: Aug. 27, 2012

(86) PCT No.: PCT/US2012/052516
§ 371 (c)(1),
(2), (4) Date: Apr. 9, 2014

(87) PCT Pub. No.: WO2013/033016
PCT Pub. Date: Mar. 7, 2013

(65) Prior Publication Data
US 2014/0301151 A1    Oct. 9, 2014

Related U.S. Application Data

(60) Provisional application No. 61/529,078, filed on Aug. 30, 2011.

(51) Int. Cl.
| G11C 7/00 | (2006.01) |
|---|---|
| G11C 11/4091 | (2006.01) |
| G11C 8/08 | (2006.01) |
| G11C 8/10 | (2006.01) |
| G11C 8/14 | (2006.01) |
| G11C 11/408 | (2006.01) |
| G11C 11/4094 | (2006.01) |
| G11C 11/4097 | (2006.01) |
| G11C 5/02 | (2006.01) |

(Continued)

(52) U.S. Cl.
CPC ............ *G11C 11/4091* (2013.01); *G11C 5/025* (2013.01); *G11C 7/08* (2013.01); *G11C 8/08* (2013.01); *G11C 8/10* (2013.01); *G11C 8/14* (2013.01); *G11C 11/4085* (2013.01); *G11C 11/4094* (2013.01); *G11C 11/4097* (2013.01); *G11C 8/12* (2013.01)

(58) Field of Classification Search
CPC ...... G11C 11/4091; G11C 8/08; G11C 5/025; G11C 8/12; G11C 8/10; G11C 8/14; G11C 2207/065
USPC .................. 365/205, 63, 230.03, 230.06, 207
See application file for complete search history.

(56) References Cited

U.S. PATENT DOCUMENTS

| 5,717,645 A | 2/1998 | Kengeri et al. |
|---|---|---|
| 6,049,499 A | 4/2000 | Sukegawa et al. |

(Continued)

OTHER PUBLICATIONS

Internatioanl Search Report and Written Opinion dated Jan. 21, 2013 in International Application No. PCT/US2012/052516. 9 pages.

(Continued)

*Primary Examiner* — David Lam
(74) *Attorney, Agent, or Firm* — Silicon Edge Law Group LLP; Arthur J. Behiel (57) ABSTRACT

Described are dynamic, random-access memories (DRAM) architectures and methods for subdividing memory activation into fractions of a page. Circuitry in support of sub-page activation is placed in the intersections of local wordline drivers and sense-amplifier stripes to allow independent control of adjacent arrays of memory cells without significant area overhead.

21 Claims, 10 Drawing Sheets

(51) Int. Cl.
  *G11C 7/08* (2006.01)
  *G11C 8/12* (2006.01)

(56) References Cited

U.S. PATENT DOCUMENTS

| | | | |
|---|---|---|---|
| 6,088,252 | A | 7/2000 | Fujisawa et al. |
| 6,097,648 | A | 8/2000 | Bessho et al. |
| RE37,409 | E | 10/2001 | Barth et al. |
| 6,442,088 | B1 | 8/2002 | Tsuchida et al. |
| 7,099,217 | B2 * | 8/2006 | Haga et al. .......... 365/205 |
| 7,187,615 | B2 | 3/2007 | Park et al. |
| 7,679,985 | B2 | 3/2010 | Park et al. |
| 7,852,703 | B2 | 12/2010 | Jang et al. |
| 7,869,241 | B2 | 1/2011 | Yu et al. |
| 8,130,582 | B2 * | 3/2012 | Shimano et al. .......... 365/210.1 |
| 8,547,765 | B2 * | 10/2013 | Ichinose .......... 365/205 |
| 2002/0147884 | A1 | 10/2002 | Peters |
| 2003/0011021 | A1 | 1/2003 | Schneider |
| 2006/0271748 | A1 | 11/2006 | Jain et al. |
| 2010/0091589 | A1 | 4/2010 | Lee |

OTHER PUBLICATIONS

EP Extended Search Report dated Mar. 11, 2015 re Application No. 12827743.1. 8 pages.

EP Communication pursuant to Rules 70(2) and 70a(2) EPC dated Mar. 27, 2015 in EP Application No. 12827743.1. 1 page.

EP Response dated May 28, 2015 in EP Application No. 12827743.1, Includes New Claims and New Description pp. 1 and 1a (Highlighted and Clear copies). 16 pages.

* cited by examiner

DISTRIBUTED SUB-PAGE SELECTION

TECHNICAL FIELD

The subject matter presented herein relates generally to high-speed electronic signaling in support of memory access.

BACKGROUND

Processing units execute instructions to read, manipulate, and write data. Both the instructions and data are commonly stored in a separate memory, which is coupled to the processing unit via a communication channel, or memory channel. In a common example, a typical personal computer includes a central processing unit (CPU), a quantity of dynamic, random-access memory (DRAM), and a memory controller IC that manages the flow of information between the CPU and DRAM.

DRAMs store information in arrays of memory cells arranged in rows and columns. Memory cells are commonly accessed (connected to sense amplifiers) one row at a time, in which case a row is often termed a "page." The number of memory cells per unit area, termed memory density, grows with process improvements in DRAM fabrication. Such density improvements reduce the price of storage, but also increase the number of memory cells in a given page. If a page provides access to the contents of more memory cells than can be used by the processing unit requesting the access, then the power used to access the unneeded information is wasted.

BRIEF DESCRIPTION OF THE FIGURES

The present invention is illustrated by way of example, and not by way of limitation, in the figures of the accompanying drawings and in which like reference numerals refer to similar elements and in which.

DETAILED DESCRIPTION

Figure 1:
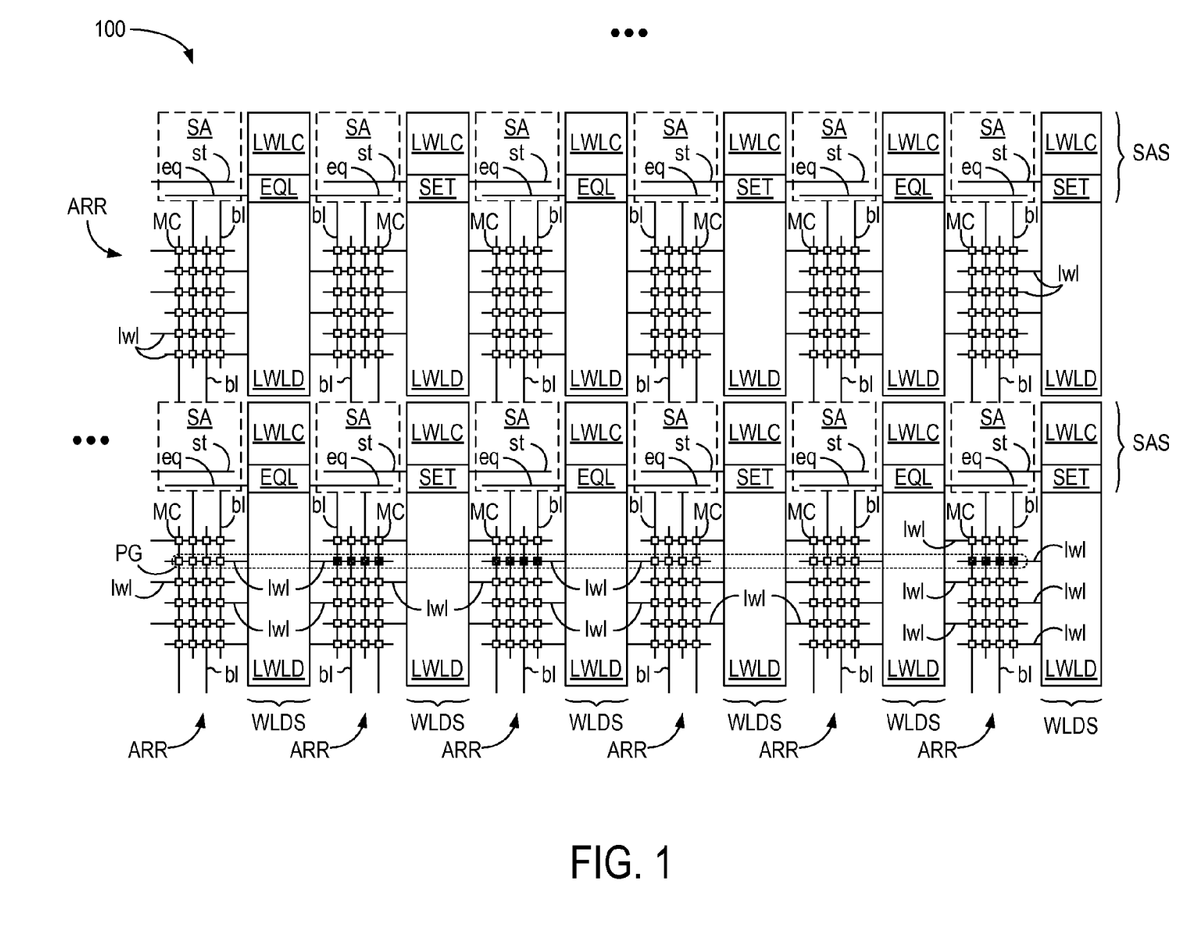
FIG. 1 depicts a portion, such as a bank, of an integrated-circuit (IC) DRAM device 100 upon which is instantiated a hierarchical memory in accordance with one embodiment.

FIG. 1 depicts a portion, such as a bank, of an integrated-circuit (IC) DRAM device 100 upon which is instantiated a hierarchical memory in accordance with one embodiment. The memory includes rows and columns of memory-cell arrays ARR, each of which includes rows and columns of, e.g., "1T" DRAM cells MC. Each row of memory cells MC, extending across horizontally adjacent arrays ARR in FIG. 1, is collectively termed a "page" PG, one of which is highlighted using a dashed boundary. DRAM pages are routinely referred to as "rows" as the entire page of memory cells is activated by placing a signal representing a decoded row address on a global wordline conductor (not shown in FIG. 1) that extends across the horizontally adjacent arrays. As used herein, however, the term "page" refers to a logical row of memory cells that extends through multiple arrays, and the term "row" refers to a row of memory cells specific to an array.

Price per bit is a primary driver in the design of DRAM devices. As a consequence, the number and placement of arrays and memory cells in a given DRAM architecture are selected to maximize the area occupied by the arrays, and thus the number of memory cells MC. Unfortunately, DRAMs optimized for memory cell density often have page sizes that are considerably larger than necessary for most data access patterns. The power used for page activation is proportional to the number of memory cells in a page, so activating unnecessarily large pages wastes power. DRAM 100 addresses mismatches between page size and access granularity by allowing for sub-page activation, and does so with little or no impact on the area dedicated to the arrays. With reference to the highlighted page PG, the memory cells MC indicated in solid black—a sub-page—can be accessed independent of the remaining memory cells in the same page PG, and vice versa. A sub-page is half of a full page in this example, but other fractions can be used. Some embodiments can be configured to support different page sizes, or to switch between page sizes responsive to, e.g., memory commands.

Memory arrays ARR are separated by sense-amplifier stripes SAS and wordline-driver stripes adjacent the respective horizontal and vertical array boundaries. Each sense-amplifier stripe SAS includes collections of sense amplifiers SA, each collection of sense-amplifiers SA to sense a selected row of memory cells MC in one of the two immediately adjacent arrays ARR. Each wordline-driver stripe WLDS includes local wordline drivers LWLD that selectively enable rows of memory cells MC. With reference to the upper-right array ARR of FIG. 1, for example, each row of memory cells MC is coupled to a local wordline driver LWLD via a local wordline lwl, and each column of memory cells is connected to a corresponding collection of sense amplifiers SA via a respective bitline bl. To read from one or more memory cells MC in a given array ARR, device 100 activates all memory cells MC in the corresponding row using the respective local wordline lwl, and thus presents the contents of the active row to the corresponding sense amplifiers SA via bitlines bl. Sense amplifiers SA sense and store the contents of the row. Data interface circuitry (not shown) then reads or changes the contents of the sense amplifier. The information stored in the sense amplifiers is written back to the active row to refresh or write new data to the memory cells before another row is activated.

The intersection of each sense-amplifier and wordline-driver stripe includes local wordline control circuitry LWLC and either a set circuit SET or an equalization circuit EQL. Control circuitry LWLC selectively enables local wordline drivers LWLD within the same driver stripe WLDS to activate and sense rows of memory cells in a subset of arrays, and thus to access a sub-page of information. The set and equalization circuits SET and EQL alternate between stripes WLDS and are used together to control the adjacent sense amplifiers.

Each of two set lines st extends into a respective, adjacent collection of sense amplifiers SA from each set circuit SET, and each of two equalization lines eq extends into a respective, adjacent collection of sense amplifiers from each circuit EQ. The sense-amplifier control signals st and eq on like-identified signal conductors independently control sub-pages of memory cells. The sub-page control afforded by the additional logic at the intersections of the sense-amplifier and wordline-driver stripes is accomplished with little added circuit complexity, and consequently with little or no area penalty.

FIGS. 2A-2D show DRAM device 100 of FIG. 1, detailing certain features and omitting others for ease of illustration. For example, arrays ARR are simplified by omission of memory cells MC and bitlines bl, and additional wordline select signals and associated conductors are added in support of sub-page activation. Like-identified elements are the same or similar in different figures. Bold lines and signal designations identify asserted signals. Signal names ending in "_n" are active low. In general, circuit elements are labeled using capital letters, whereas conductors and their related signals are labeled using lower-case letters. Whether a given reference is to a signal or a corresponding conductor will be clear in context.

Sense-amplifier stripe SAS is provided with three global (shared by the entire stripe) control signals; namely, wordline-select signal wlsel_n to each local wordline control circuit LWLC, set signal st_n to each set circuit SET, and equalization signal eq_n to each equalization circuit EQL. These signals collectively allow address and control circuitry (not shown) to select and sense the memory cells associated with local wordlines lwl of a selected page PG. These signals and their derivation and use to guarantee the necessary sequence and timing relationship of wordline activation and de-activation and setting and equalizing of sense-amplifiers are well known to those of skill in the art, so a detailed treatment is omitted.

Wordline driver stripes WLDS that include a set circuit SET are each provided with four global control signals, a left-select signal sell_n<#>, a right-select signal selr_n<#>, and a pair of local wordline-select signals wlsel[1:0]_n<#>. Signals wlsel[1:0]_n<#> allow the external control circuitry to select between two groups of local wordlines lwl, each of which extends into either one or two adjacent arrays ARR. Main wordlines mwl_n<3:0> extend across arrays ARR. These main wordline signals and control signals wlc0 and wlc1 from local wordline control circuits LWLC control switches SW within local wordline drivers LWLD to select the local wordlines lwl in one page PG of local wordlines from among the sets specified using signal wlse[1:0]_n<#>. Finally, the left and right select signals sell_n<#> and selr_n<#> allow the external control circuitry to independently control the left and right set signals st for the respective wordline-driver stripe WLDS. Wordline driver stripes WLDS that include an equalization circuit EQL rather than a set circuit SET are similar, but their respective left and right select signals are active-high eqsell<#> and eqselr<#>. As detailed below, these control signals allow DRAM 100 to access sub-pages of data.

The rightmost wordline-driver stripe WLDS is asymmetrical in that it does not support set or equalization signals that extend to the right, but may nevertheless include signaling resources for a right select signal selr_n<0>. Including this optional circuitry, highlighted using italic text and a dashed signal line, can simplify design and layout by allowing peripheral wordline-driver stripes to be identical to the symmetrical inner stripes. Support for unused set or equalization signals is omitted in other embodiments to save area, and is omitted from FIGS. 2B-2D.

Figure 2A:
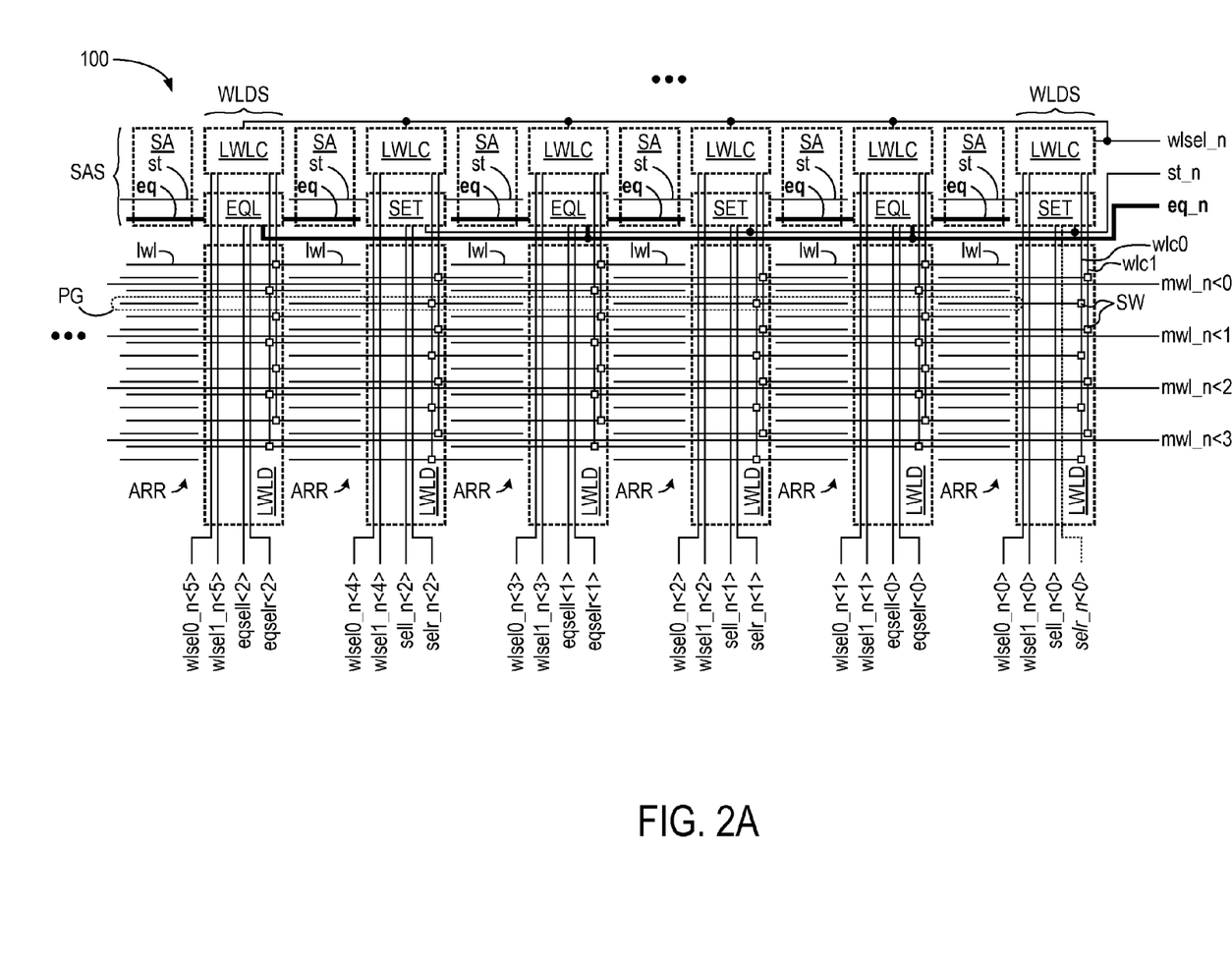
FIGS. 2A-2D show DRAM device 100 of FIG. 1, detailing certain features and omitting others for ease of illustration.

DRAM 100 is in a quiescent state in FIG. 2A. No memory cells are being accessed. Equalization signal eq_n is asserted, which causes equalization circuits EQL to assert signals eq and thereby equalize all of sense amplifiers SA in preparation for a subsequent row activation. The process of equalization is detailed below in connection with FIG. 7. Briefly, each sense amplifier with a collection of sense amplifiers SA is coupled to complementary pairs of bitlines bl (FIG. 1) that extend into respective, adjacent memory arrays. Asserting signals eq causes the sense amplifiers to preset complementary bitlines to the same voltage.

Figure 2B:
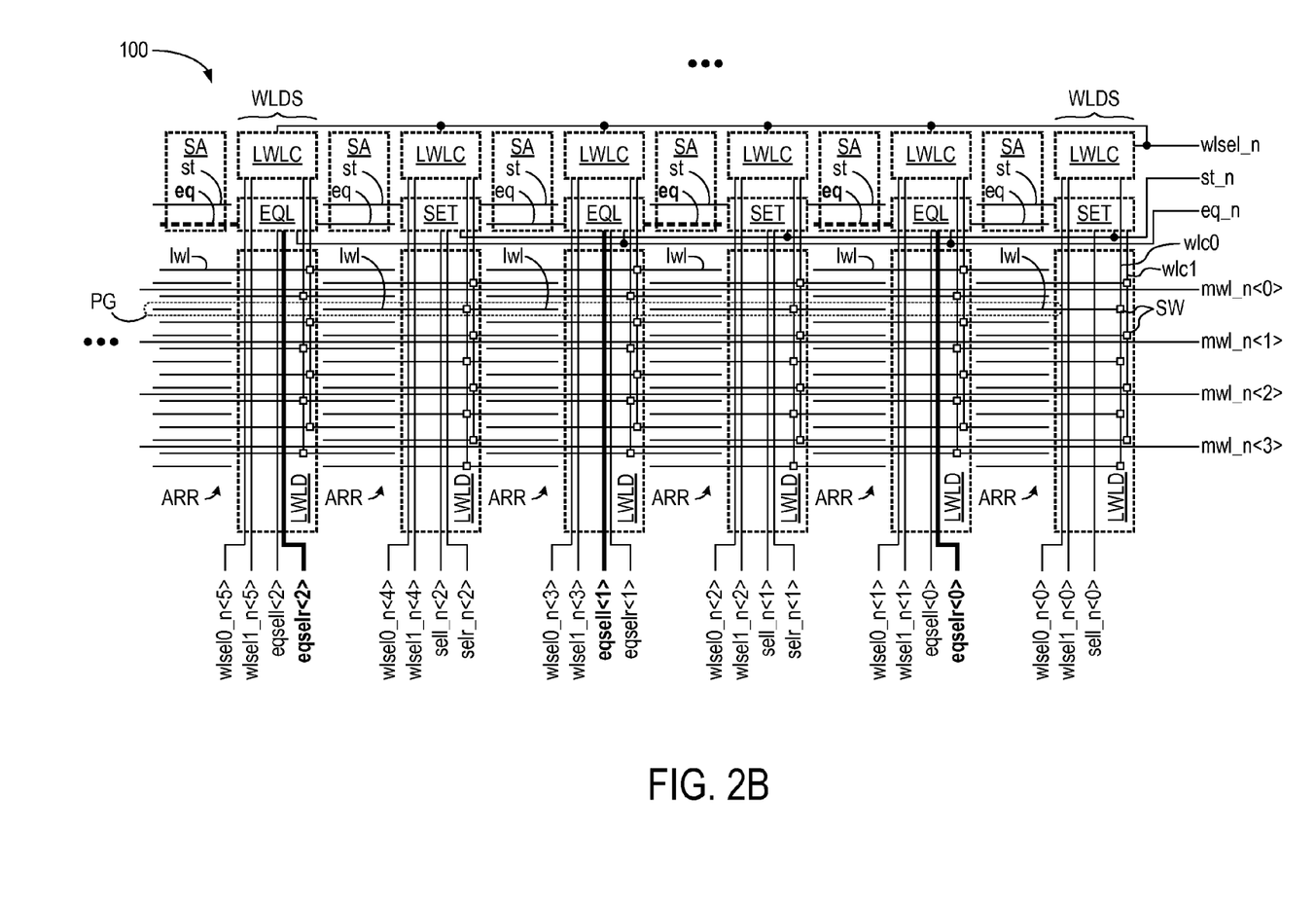

FIG. 2B depicts the same DRAM 100 of FIG. 2A in which half of equalization signals eq are deasserted to allow the bitlines in half of arrays ARR to float in preparation of a sense operation. In this example, signal eq_n is de-asserted and right and left select signals eqselr<2,0> and eqsell<1> are asserted. Each asserted select signal causes a respective equalization circuit EQL to de-assert one of equalization signals eq to ready sense amplifiers SA for a sense operation. Asserting left select signal eqsell<1>, for example, deasserts the signal eq extending to the left of the middle equalization circuit EQL. The equalization signals eq that remain asserted from the prior depiction of FIG. 2A are highlighted using bold lines and signal names, but are dashed in the example of FIG. 2B to distinguish them from the newly asserted left and right select signals eqselr<2,0> and eqsell<1>.

Figure 2C:
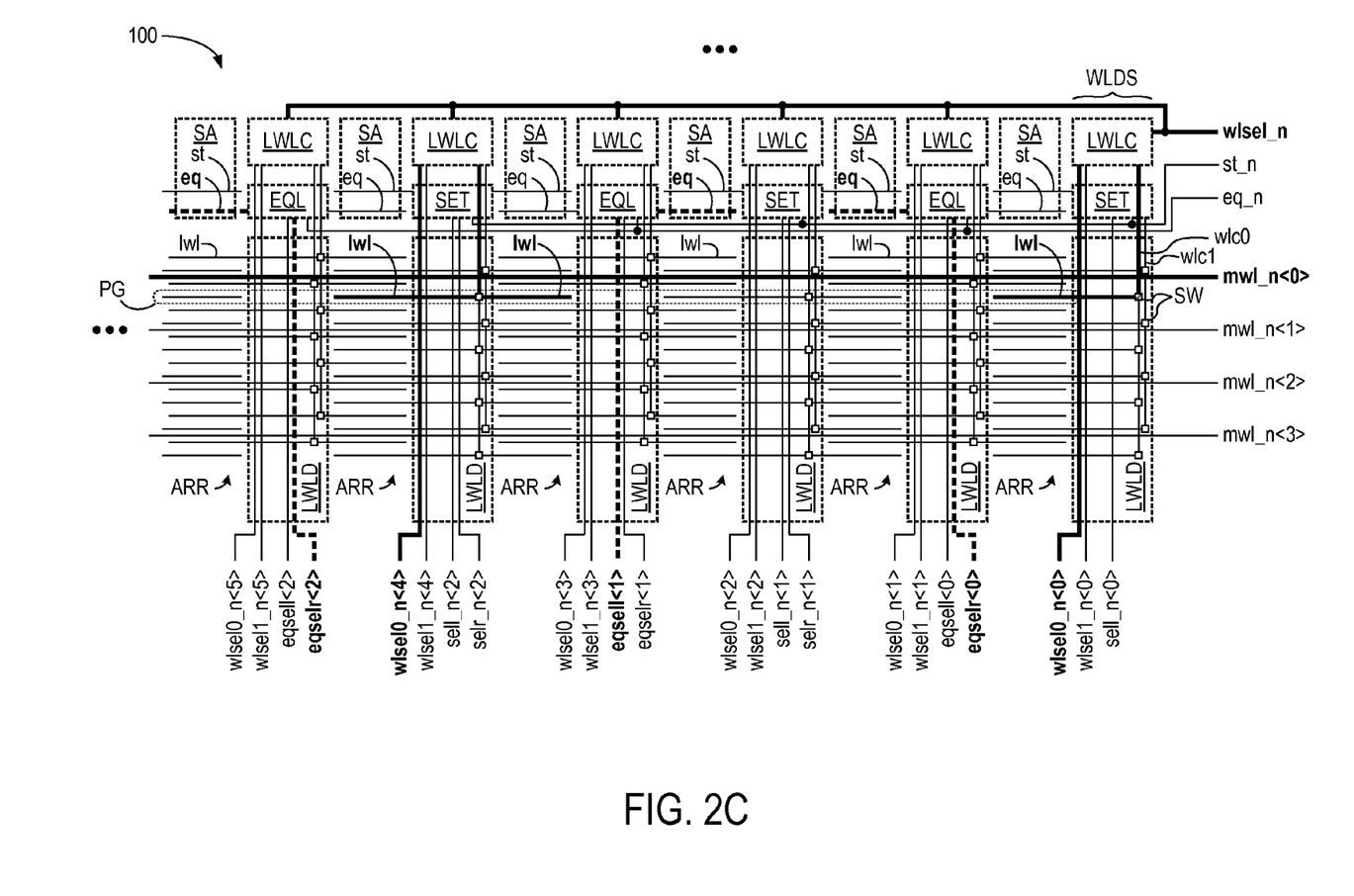

FIG. 2C depicts the same DRAM 100 of FIGS. 2A and 2B with wordline select signals asserted to activate a sub-page. Local wordline select circuits LWLC, responsive to the assertion of wordline select signals wlsel_n, wlsel0_n<0>, and wlsel0_n<4>, select collections of local wordlines within three of the six arrays. The asserted main wordline mwl_n instigates the second local wordline driver LWLD from the left to select a pair of local wordlines lwl, and the rightmost local wordline driver LWLD to select one local wordline lwl in the same page PG. As illustrated using bold local wordlines lwl, only half of the local wordlines lwl in the accessed page PG are asserted. Thus, only three of the six arrays ARR are accessed. Signals eqselr<2,0> and eqsell<1> remain asserted, and are thus highlighted using bold lines and font.

Figure 2D:
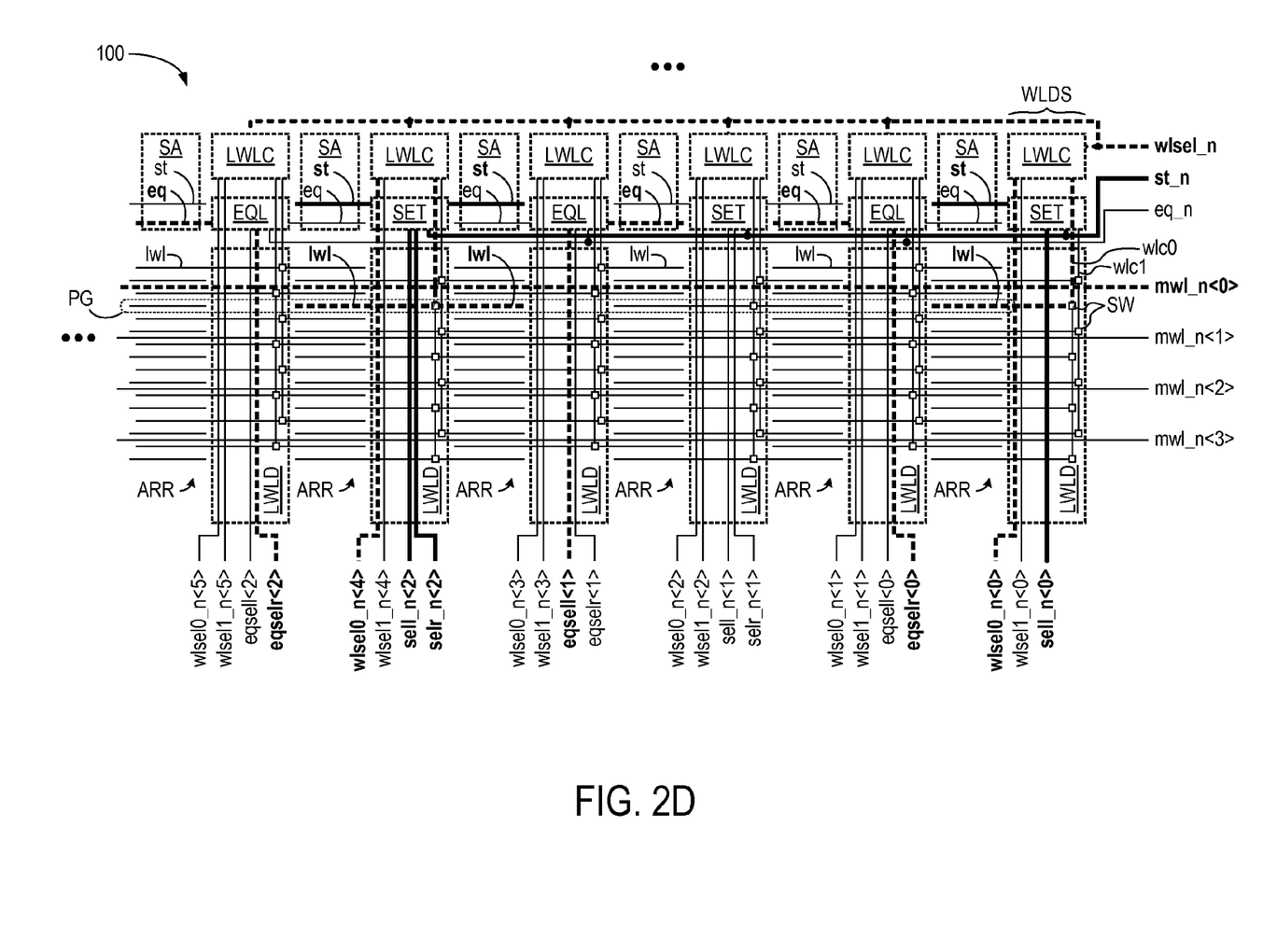

FIG. 2D depicts the same DRAM 100 of FIGS. 2A-2C when half of the sense amplifiers SA are "set" to sense an accessed sub-page. Set signal st_n is asserted to control each set circuit SET in stripe SAS, and the left and right select signals sell_n<2,0> and selr_n<2> are asserted to control specific sense amplifiers SA. In this example, the left select signal sell_n<0> causes the rightmost set circuit SET to assert set signal st to its left, and select signals sell_n<2> and selr_n<2> cause a respective set circuit SET to assert both its left and right set signals st. The three sense amplifiers SA with asserted set signals and de-asserted equalization signals sense the contents of the sub-page accessed via the asserted local wordlines lwl. The sensed data bits, now stored in the three enabled sense amplifier collections, can then be read from or written to using conventional circuitry and methods, which are well known to those of skill in the art. The information stored in the sense amplifiers is eventually written back to the active sub-page, again using well known circuitry and methods.

Figure 3:
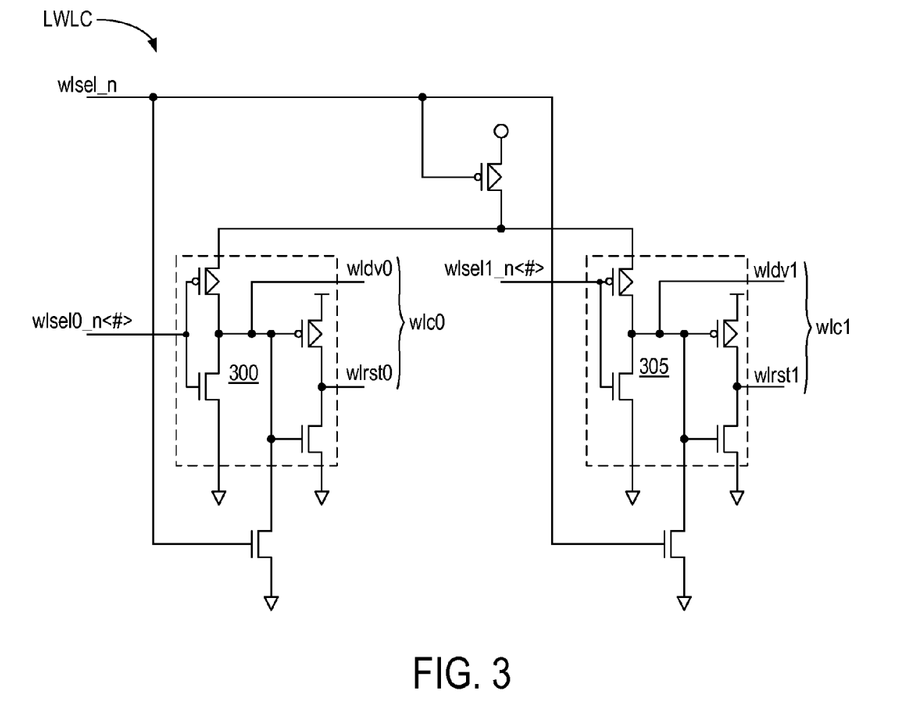
FIG. 3 details an embodiment of local wordline control circuit LWLC of FIGS. 1 and 2A-2D.

FIG. 3 details an embodiment of local wordline control circuit LWLC of FIGS. 1 and 2A-2D. Asserting wordline select signal wlsel_n enables two pairs of CMOS inverters 300 and 305, allowing signals wlsel[1:0]_n to determine the levels provided by respective control signals wlc[1:0]. Each of control signals wlc[1:0] includes a wordline drive signal wldv and a wordline reset signal wlrst. Asserting one of signals wlsel[1:0]_n respectively asserts and de-asserts the corresponding wordline drive and reset signals.

Figure 4:
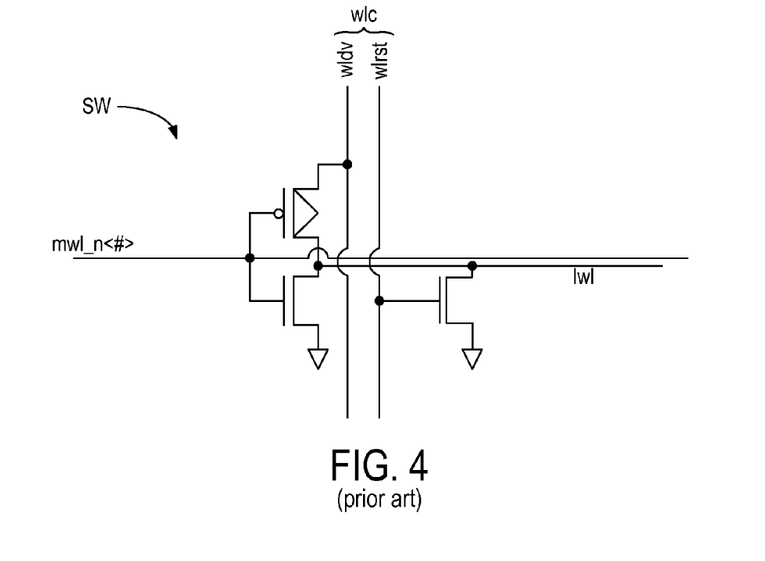
FIG. 4 (prior art) depicts an embodiment of a switch SW within local wordline driver LWLD of FIGS. 1 and 2A-2D.

FIG. 4 (prior art) depicts an embodiment of a switch SW within local wordline driver LWLD of FIGS. 1 and 2A-2D. Switch SW responds to main wordline signal mwl_n<#> and driver and reset signals wldv and wlrst from a control circuit LWLC like that of FIG. 3 to selectively assert a local wordline signal lwl. As shown in e.g. FIGS. 2A-2D, the local wordlines supporting wordline signals lwl extend from a local wordline control circuit LWLC into one or a pair of immediately adjacent arrays ARR.

Figure 5:
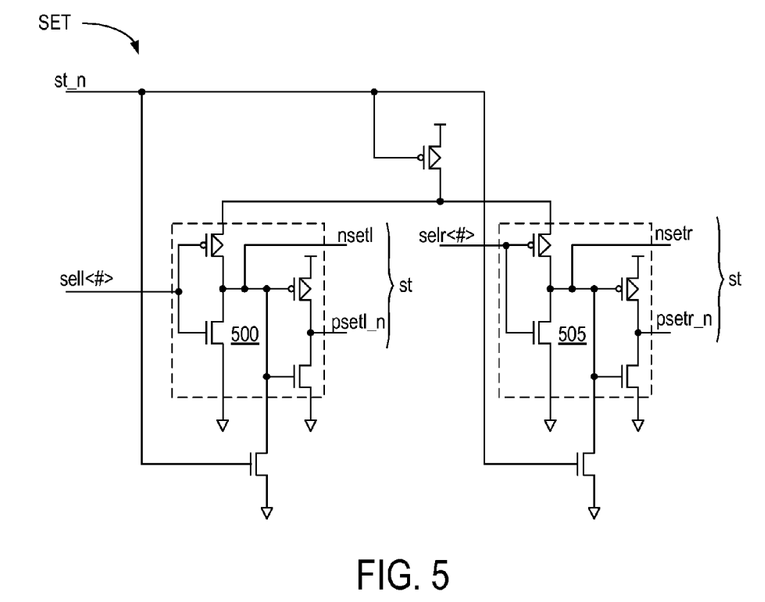
FIG. 5 details an embodiment of one of set circuits SET of FIGS. 1 and 2A-2D.

FIG. 5 details an embodiment of one of set circuits SET of FIGS. 1 and 2A-2D. Asserting signal st_n enables two pairs of CMOS inverters 500 and 505, allowing a pair of select signals sell_n<#> and selr_n<#> to assert respective set signals st. With reference to FIG. 2A, select signals sell_n<#> and selr_n<#> might be numbered 2, 1, or 0 to distinguish the three set circuits SET. Signal sell_n<#>, when asserted, asserts signals nsetl and psetl_n to cause the sense amplifiers SA to the left of the set circuit to sense the values presented on its bitlines. Likewise, signal selr_n<#>, when asserted, asserts signals nsetr and psetr_n to cause the sense amplifier to the right to sense the values presented on its bitlines. Selective application of signals sell_n<#> and selr_n<#> thus allows set circuit SET to activate one, both, or neither adjacent collection of sense amplifiers SA to read from one, both, or neither of the associated arrays ARR. As noted above in connection with FIG. 2A, peripheral wordline-driver stripes may omit circuitry used to drive select or equalization signals in one direction (e.g., to drive a set signal to the right). In such cases one of inverter pairs 500 and 505 and its associated pull-down transistor can be omitted.

Figure 6:
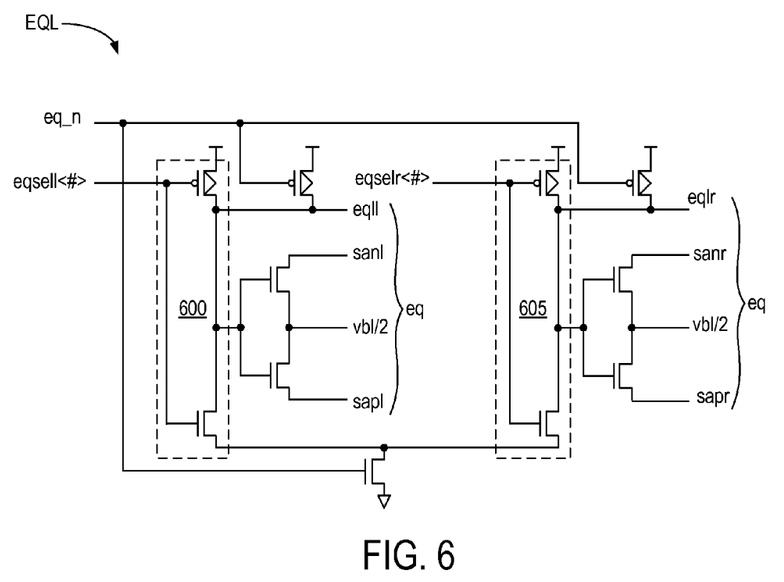
FIG. 6 details an embodiment of equalization circuits EQL of FIGS. 1 and 2A-2D.

FIG. 6 details an embodiment of equalization circuits EQL of FIGS. 1 and 2A-2D. Asserting set signal eq_n enables two CMOS inverters 600 and 605, allowing a pair of select signals eqsell<#> and eqselr<#> to control respective left and right equalization signals eqll and eqlr. Select signals eqsell<#> and eqselr<#> additionally control respective pairs of sense-amplifier control signal pairs sanl/sapl and sanr/sapr. The equalization signals that control a given sense amplifier are de-asserted to allow for sensing, so asserting the left and right select signals eqsell<#> and eqselr<#> de-asserts their respective equalization signals.

Figure 7:
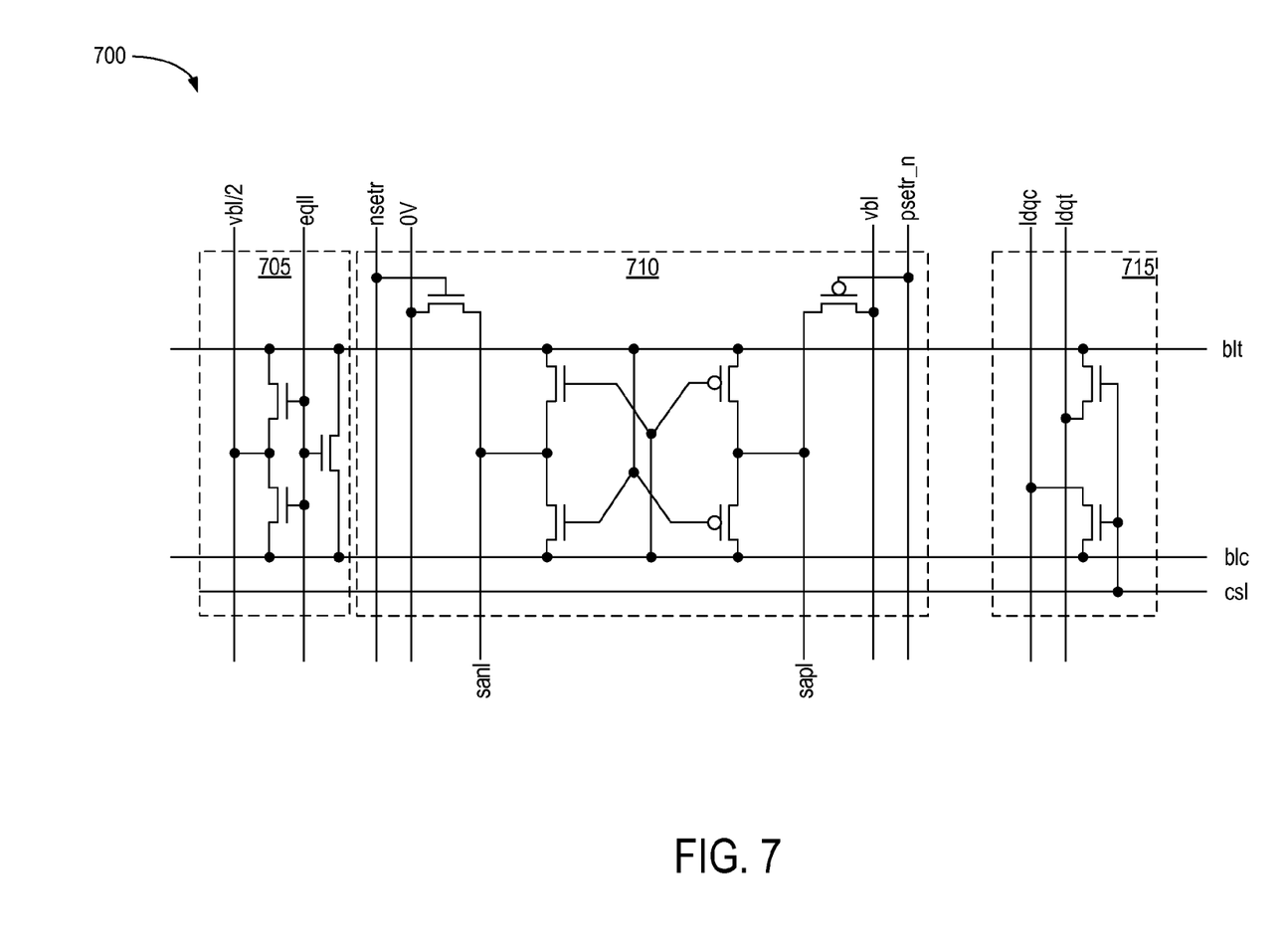
FIG. 7 details a sense amplifier 700 typical of those that make up each collection of sense amplifiers SA in accordance with one embodiment.

FIG. 7 details a sense amplifier 700 typical of those that make up each collection of sense amplifiers SA in accordance with one embodiment. Sense amplifier 700 equalizes and senses the voltage difference between true and complement bitlines blt and blc using equalization circuitry 705 and sense circuit 710, and accesses the sensed bit using connect logic 715. A similar circuit is provided for each bitline pair. Although the transistor arrangement of FIG. 7 is traditional, it is of note that the equalization signals come from a circuit on one side of the sense amplifier SA collection and the set signals come from a circuit on the other side of the sense amplifier SA collection.

Asserting signal eqll equalizes both bitlines blt and blc to half of some specified bitline voltage vbl, or vbl/2. Though not shown here, accessing a memory cell on one of bitlines blt and blc causes the voltage on the bitline connected to the accessed memory cell to rise or fall slightly, depending upon whether the voltage stored in the memory cell is higher or lower than voltage vbl/2. Asserting signals nsetr, psetr_n, sanl, and sapl causes sense circuit 710 to amplify the resulting voltage difference between the two bitlines, driving one bitline to zero volts and the other to bitline voltage vbl. Finally, asserting a column-select signal est enables connect logic 715 to connect bitlines blt and blc to local data lines ldqt and ldqc, respectively. External circuitry (not shown) can then read the value in sense circuit 710, and thus the contents of the accessed memory cell, or can present a complementary data bit on lines ldqt and ldqc to write data to sense circuit 710. Reading from a memory cell destroys it contents, so the bit stored in sense circuit 710 is written back to the memory cells irrespective of whether the bit was altered by a write operation. These operations and the circuitry that controls them are well known to those of skill in the art.

Figure 8A:
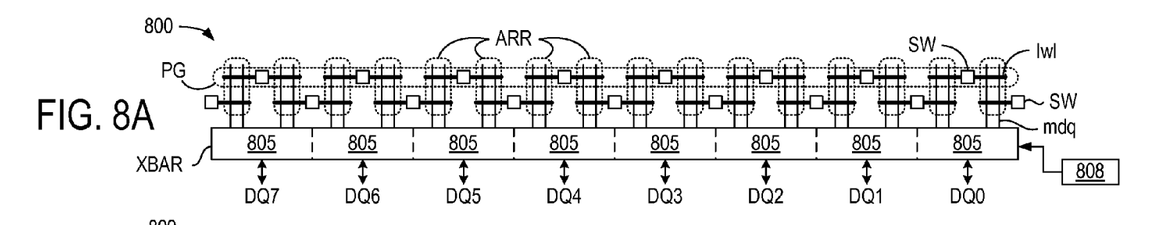
FIGS. 8A-8C are high-level depictions of a memory 800 illustrating how an embodiment of the type described herein can support full-width, half-width, and quarter-width page activation.
Figure 8B:
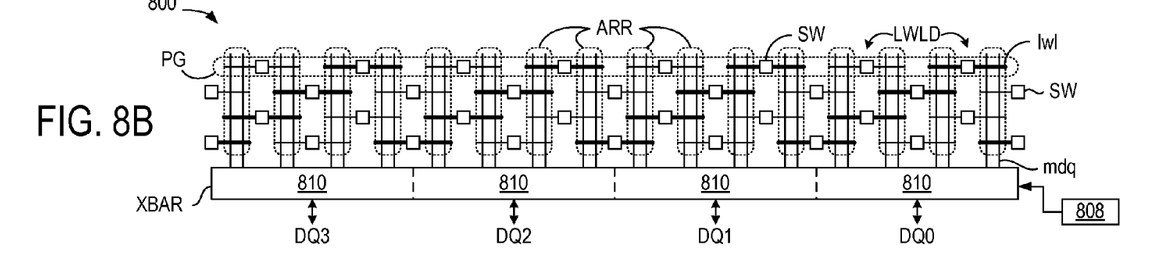
Figure 8C:
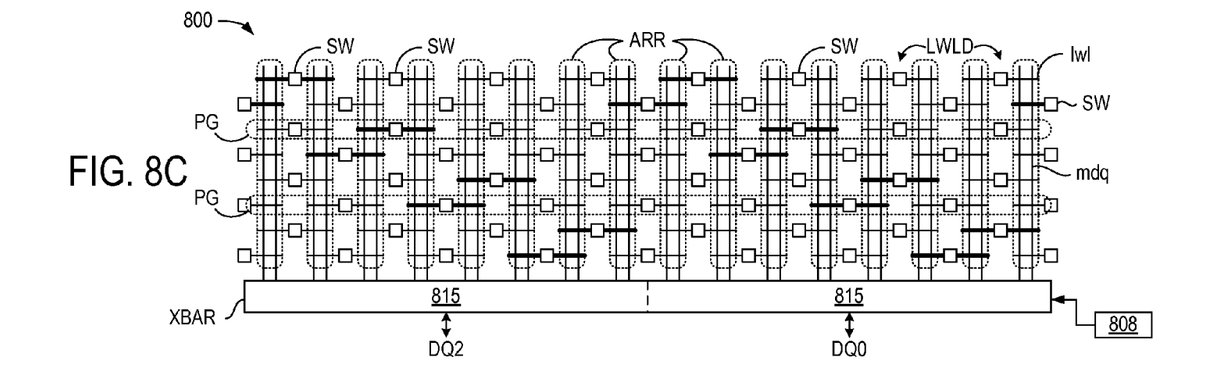

FIGS. 8A-8C are high-level depictions of a memory 800 illustrating how an embodiment of the type described herein can support full-width, half-width, and quarter-width page activation. Memory 800 can be fixed to support one of these activation widths using relatively permanent programming options, such as wirebonding, fuses, or antifuses. In other embodiments memory 800 can be preset, as during a power-on sequence, to operate in one of these activation widths, or can dynamically switch between widths in different operational modes.

Referring first to FIG. 8A, memory 800 includes two rows of local wordlines lwl, pairs of which are driven via a central switch SW as described previously. Each row of local wordlines lwl provides access to a physical page PG of memory cells (not shown). The lower row of local wordlines terminates with switches SW, and these page-end switches drive but one local wordline lwl. Memory 800 is shown to include just two rows of local wordlines lwl to illustrate the two types of page activation: either all the memory cells in a row of the type terminating in local wordlines or all the memory cells in a row of the type terminating in switches SW. Memory 800 includes many more rows of local wordlines alternating between these two types.

Main data lines mdq extend vertically through arrays ARR to a cross-bar switch XBAR to carry data to and from selected rows of memory cells MC (FIG. 1). In this simple illustration each array provides two bits of data on two main data lines mdq. As with other signal lines depicted herein, each main data line mdq can represent a differential pair. A mode signal stored in a mode register 808 logically divides cross-bar switch XBAR into eight subsections 805, each of which subsection connects a selected one of four main data lines mdq to a respective one of data lines DQ[7:0]. Interleaving switches SW as shown produces two page types, as shown. Asserting all local wordlines lwl in either page type accesses all sixteen arrays, and thus allows full-page access from memory 800. The illustration of FIG. 8A shows four main data lines mdq per subsection 805 for ease of illustration. Practical implementations can be expected to include many more.

FIG. 8B shows the same memory 800 of FIG. 8A, but two additional rows of local wordlines lwl are shown to illustrate how memory 800 works when configured in a half-width mode (e.g., when mode register 808 stores a value that configures memory 800 to support half-width sub-page activation). Half of local wordlines lwl are highlighted in each row using relatively bold lines to illustrate four possible types of sub-page activations, two for each row type. In the uppermost row, alternate switches SW are enabled to assert half of local wordlines lwl. The third row from the top shows the second type of half-page activation for a physically identical page. As in the prior example, alternate switches SW are enabled to assert half of local wordlines lwl, but the enabled switches are the ones left inactive in the last example. The second type of page similarly supports two patterns of half-page activation, as illustrated in the second and lowermost rows of FIG. 8B. Cross-bar switch XBAR has four subsections 810 in this configuration, half the number as in the configuration of FIG.

8A, each of which connects a selected one of eight main data lines mdq to a respective one of data lines DQ[3:0].

FIG. 8C shows the same memory 800 of FIGS. 8A and 8B, but four additional pages are shown to illustrate how memory 800 works when configured in a quarter-width mode (e.g., when memory 800 is configured to support quarter-width sub-page activation). A quarter of local wordlines lwl are highlighted in each row using relatively bold lines to illustrate eight possible patterns of sub-page activation. There are two page types, as noted in connection in FIG. 8A. For quarter-page activation, each of the two page types supports four patterns of activation. Only one page is active at a time: eight are highlighted to illustrate the eight possibilities of local wordline assertion. Cross-bar switch XBAR has two subsections 815 in this configuration, half the number as in the configuration of FIG. 8B, each of which connects a selected one of sixteen main data lines mdq to a respective one of data lines DQ[1:0].

In the uppermost row, starting with the leftmost switch SW, every fourth switch SW enables its associated local wordlines lwl. Every fourth switch SW can also be enabled starting with the second, third, or fourth switch SW from the left. In the second row, again starting with the leftmost switch SW, every fourth switch SW enables its associated local wordline or lines lwl. Every fourth switch SW can also be enabled starting with the second, third, or fourth switch SW from the left. All eight of these possibilities are shown in FIG. 8C. Subsections 815 of cross-bar switch XBAR are wide enough to select any main data line mdq within eight arrays. Though not shown, memory 800 can be further sub-divided to provide yet smaller sub-pages.

Figure 9:
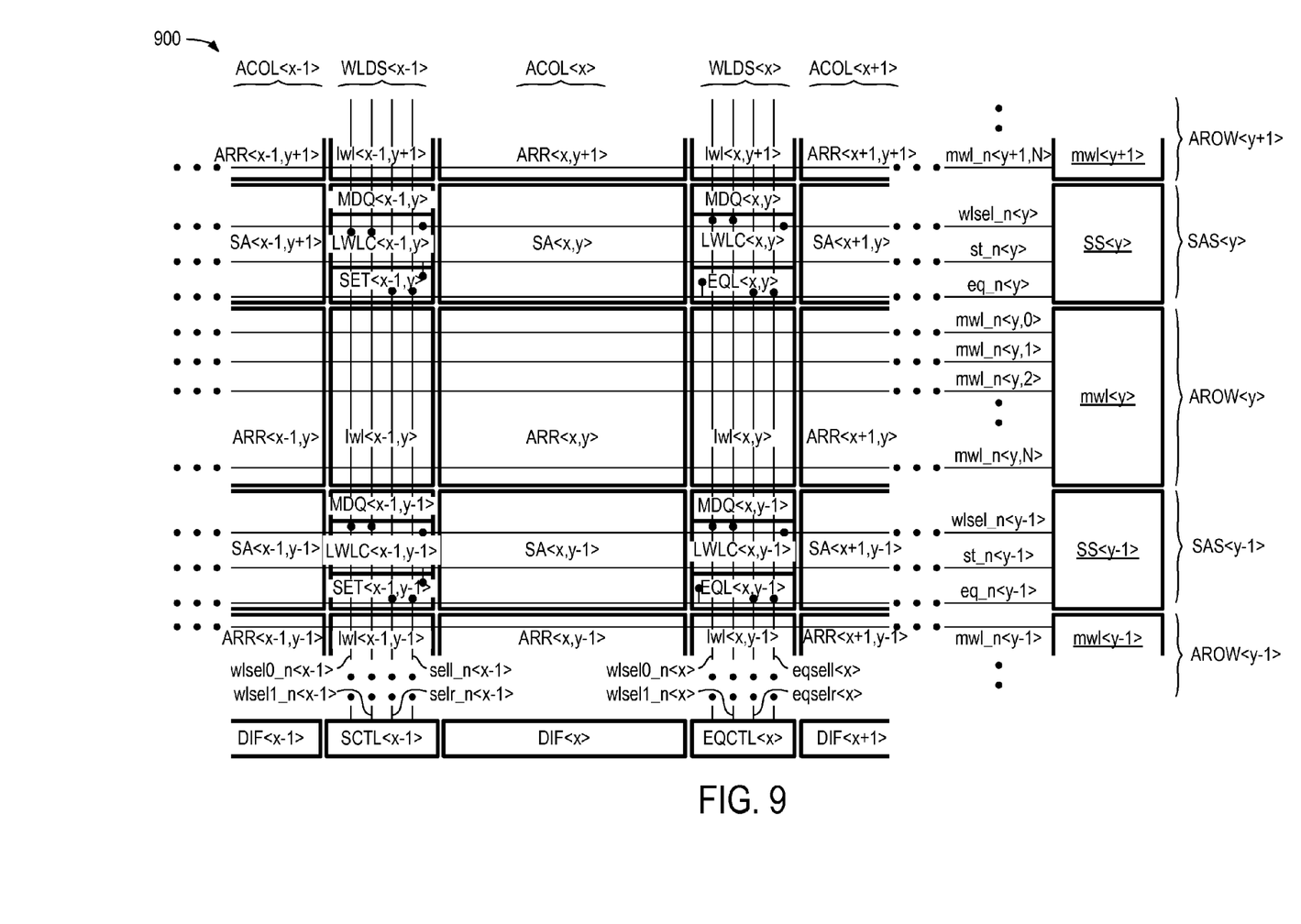
FIG. 9 depicts a DRAM system 900 in accordance with another embodiment.

FIG. 9 depicts a DRAM system 900 in accordance with another embodiment. System 900 is similar to DRAM 100, detailed above, with like-identified elements being the same or similar. System 900 includes a two-dimensional array of arrays ARR, with the relative row and column positions indicated using respective x and y coordinates. For example, the central array ARR<x,y> is in array column ACOL<x> and array row AROW<y>. Supporting wordline driver stripes WLDS and sense-amplifier stripes SAS are likewise designated using x and y coordinates.

Each sense amplifier stripe SAS<#> includes stripe select logic to selectively assert respective signals wlsel_n<#>, st_n<#>, and eq_n<#> in the manner discussed above in connection with FIGS. 2A-2D. A main wordline driver mwl<#> likewise controls N+1 main wordlines mwl_n<#,N:0> in each array row AROW<#>. At the bottom of FIG. 9, each array column ACOL<#> includes a data interface DIF<#> connected to the sense amplifiers in that array column via main data lines mdq (FIGS. 8A-8C).

Alternate wordline driver stripes WLDS<#> include either set circuitry SET or equalization circuitry EQL. Wordline driver stripes that include set circuitry also include set control logic SCTL<#> that issues wordline select signals wlsel0_n<#>/wlsel1_n<#> and set select signals sell_n<#> selr_n<#>. Wordline driver stripes that include equalization circuitry also include equalization control logic EQCTL<#>, which issues wordline select signals wlsel0_n<#> wlsel1_n<#> and equalization select signals eqsell<#> eqselr<#>. Control circuits SCTL<#> and EQCTL<#> derive their respective control signals by decoding address bits and a mode signal from, e.g., mode register 808 of FIGS. 8A-8C.

In the foregoing description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Moreover, the foregoing descriptions focus primarily on read access, but these embodiments likewise support write access, as will be well understood by those of skill in the art.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein.

While the present invention has been described in connection with specific embodiments, after reading this disclosure variation of these embodiments will be apparent to those of ordinary skill in the art. For example: the concepts detailed above can be extended to any combination of external and internal data widths; memory die in accordance with some embodiments can be soldered directly to a board and either permanently or programmably configured to a particular width; and the signal buffer can be provided on the motherboard, and possibly integrated with a memory controller, instead of included on the memory module with the memory devices. Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. §112.

What is claimed is:

1. A memory device comprising:
   a plurality of memory arrays arranged in multiple rows and multiple columns;
   a plurality of sense-amplifier stripes, a respective one of the sense amplifier stripes arranged between adjacent ones of the rows of memory arrays, each sense-amplifier stripe including collections of sense amplifiers, a respective one of the collections arranged between adjacent ones of the rows of memory arrays on each column of memory arrays;
   a plurality of wordline-driver stripes, a respective one of the wordline driver stripes arranged between each adjacent pair of the columns of memory arrays, each wordline driver stripe including a plurality of wordline driver sets, a respective one of the wordline driver sets arranged between adjacent ones of the columns of memory arrays on each row of memory arrays, each intersection of a sense-amplifier stripe and a wordline-driver stripe substantially defining an intersection region;

a plurality of equalization control circuits arranged, respectively, substantially within individual ones of a first subset of the intersection regions and absent from a second subset of the intersection regions, each equalization control circuit to collectively control a bitline equalization operation of at least one adjacent collection of sense amplifiers; and a plurality of sense control circuits arranged, respectively, substantially within individual ones of the second subset of the intersection regions and absent from the first subset of the intersection regions, each sense control circuit to collectively control a sense operation of at least one adjacent collection of sense amplifiers.

2. The memory device of claim 1, further comprising an asymmetrical wordline-driver stripe adjacent to an outboard end of an end one of the columns of memory arrays.

3. The memory device of claim 1, wherein the first and second subsets of the intersection regions alternate along each of the sense-amplifier stripes.

4. The memory device of claim 3, wherein the first and second subsets of the intersection regions alternate for adjacent wordline driver stripes.

5. The memory device of claim 1, wherein each one of the sense control circuits arranged between two adjacent collection of sense amplifiers is a double-sided sense control circuit that independently collectively controls a sense operation in both of the adjacent collections of sense amplifiers, and each one of the equalization control circuits arranged between two adjacent collections of sense amplifiers is a double-sided sense control circuit that independently collectively controls a bitline equalization operation in both of the adjacent collections of sense amplifiers.

6. The memory device of claim 5, further comprising row-wise and column-wise peripheral control circuitry to selectively activate the sense control circuits and equalization control circuits.

7. The memory device of claim 6, wherein for the double-sided sense control circuits and the double-sided equalization control circuits, the peripheral control circuitry independently controls the two sides of the double-sided sense control circuits and the double-sided equalization control circuits.

8. The memory device of claim 7, the peripheral control circuitry capable of effecting, for a selected sense amplifier stripe, sensing of data for at least three different subsets of the collections of sense amplifiers associated with that sense amplifier stripe.

9. The memory device of claim 1, further comprising local wordlines extending from each wordline-driver stripe through exactly two adjacent memory arrays.

10. The memory device of claim 1, wherein each intersection region includes a local wordline control circuit to distinguish between the wordline driver sets.

11. The memory device of claim 10, further comprising wordline select lines coupled to the local wordline control circuits to control the wordline driver set in the first subset of the intersection regions separate from the wordline driver set in the second subset of the intersection regions.

12. A memory device comprising:
a first memory array;
a first collection of sense amplifiers coupled to the first memory array via respective bitlines;

first sense control circuitry arranged at one end of the first collection of sense amplifiers, the sense control circuitry to collectively control a sense operation of the first collection of sense amplifiers; and first equalization control circuitry arranged at the other end of the first collection of sense amplifiers, the equalization control circuitry to collectively control a bitline equalization operation of the first collection of sense amplifiers.

13. The memory device of claim 12, further comprising:
a second memory array; and
a second collection of sense amplifiers coupled to the second memory array via respective bitlines, wherein the sense control circuitry collectively controls a sense operation of the second collection of sense amplifiers, the sense control circuitry interposed between the first and second collection of sense amplifiers.

14. The memory device of claim 13, further comprising first and second sense select lines coupled to the sense control circuitry to convey respective first and second sense select signals, wherein the sense control circuitry collectively controls the sense operations of the first and second collection of sense amplifiers responsive to the first and second sense select signals, respectively.

15. The memory device of claim 14, further comprising a stripe sense amplifier select signal line coupled to the sense control circuitry to convey a stripe sense signal, wherein the stripe sense signal enables the sense control circuitry responsive to the first and second sense select signals.

16. The memory device of claim 13, further comprising second equalization control circuitry arranged at the end of the second collection of sense amplifiers opposite the sense control circuitry, the second equalization control circuitry to collectively control a bitline equalization operation of the second collection of sense amplifiers.

17. The memory device of claim 12, further comprising:
a second memory array; and
a second collection of sense amplifiers coupled to the second memory array via respective bitlines, the equalization control circuitry to collectively control a bitline equalization operation of the second collection of sense amplifiers, the equalization control circuitry interposed between the first and second collections of sense amplifiers.

18. The memory device of claim 17, further comprising first and second equalization select lines coupled to the equalization control circuitry to convey respective first and second equalization select signals, wherein the equalization control circuitry collectively controls the bitline equalization operations of the first and second collections of sense amplifiers responsive to the first and second equalization select signals, respectively.

19. The memory device of claim 18, further comprising a stripe sense amplifier equalization signal line coupled to the equalization control circuitry to convey a stripe equalize signal, wherein the stripe equalize signal enables the equalization control circuitry responsive to the first and second equalization select signals.

20. The memory device of claim 17, further comprising second sense control circuitry arranged at the end of the second collection of sense amplifiers opposite the equalization control circuitry, the second sense control circuitry to collectively control a sense operation of the second collection of sense amplifiers.

21. The memory device of claim 20, further comprising first and second sense select lines coupled respectively to the first and second sense control circuitry to convey respective first and second sense select signals, wherein the first sense control circuitry collectively controls the sense operations of the first collection of sense amplifiers responsive to the first sense select signal and the second sense control circuitry collectively controls the sense operations of the second collection of sense amplifiers responsive to the second sense select signal.

* * * * *